US009521761B1

(12) United States Patent
Shotey et al.

(10) Patent No.: US 9,521,761 B1
(45) Date of Patent: Dec. 13, 2016

(54) THREADED INSERTS ON WEATHERPROOF ELECTRICAL JUNCTION BOXES

(75) Inventors: Marcus J. Shotey, Scottsdale, AZ (US); Jeffrey P. Baldwin, Phoenix, AZ (US); Joseph Giancaspro, Rio rico, AZ (US); Samuel Dumpe, Scottsdale, AZ (US)

(73) Assignee: Hubbell Incorporated, Shelton, CT (US)

( * ) Notice: Subject to any disclaimer, the term of this patent is extended or adjusted under 35 U.S.C. 154(b) by 994 days.

(21) Appl. No.: 13/209,338

(22) Filed: Aug. 12, 2011

Related U.S. Application Data

(60) Provisional application No. 61/373,225, filed on Aug. 12, 2010.

(51) Int. Cl.
*H02G 3/08* (2006.01)
*H05K 5/00* (2006.01)

(52) U.S. Cl.
CPC ...................................... *H05K 5/00* (2013.01)

(58) Field of Classification Search
CPC .............. H02G 3/08; H02G 3/10; H02G 3/12; H02G 3/086; H02G 3/20; H02G 15/06; H02G 15/076; H02G 3/088; H02G 3/16; H02G 3/0616; H02G 3/083; H05K 5/00; H05K 5/0004; B60R 16/0239; H01J 5/20

USPC ....... 174/70 C, 21 R, 24, 68.1, 19, 50, 17 R, 58,174/60, 63, 64, 559
See application file for complete search history.

(56) References Cited

U.S. PATENT DOCUMENTS

| | | | | |
|---|---|---|---|---|
| 3,728,470 A * | 4/1973 | Maier | ............................. | 174/58 |
| 4,697,044 A * | 9/1987 | Ishikawa | ............... | H05K 9/006 |
| | | | | 174/372 |
| 4,742,541 A * | 5/1988 | Cwirzen et al. | .............. | 379/412 |
| 6,831,227 B2 * | 12/2004 | Weise et al. | ..................... | 174/58 |
| 7,145,077 B2 * | 12/2006 | Weise et al. | .................... | 174/58 |
| 7,259,337 B1 * | 8/2007 | Gretz | ............................. | 174/481 |
| 8,158,884 B2 * | 4/2012 | de la Borbolla | ................ | 174/54 |
| 2010/0078188 A1 * | 4/2010 | Youssef | .................. | H02G 3/12 |
| | | | | 174/50 |
| 2011/0017485 A1 * | 1/2011 | Carbone | ............. | H02G 3/0493 |
| | | | | 174/50 |

* cited by examiner

*Primary Examiner* — Angel R Estrada
*Assistant Examiner* — Pete Lee
(74) *Attorney, Agent, or Firm* — Dickinson Wright PLLC

(57) ABSTRACT

A weatherproof electrical junction box that includes a molded electrical junction box and an insert is disclosed. Specific implementations may comprise a molded electrical box comprising four side walls, a back wall, a front opening, two screw bosses extending toward the front opening, and an unthreaded hole extending through a first side wall of the four side walls. Specific implementations may comprise an insert, the insert comprising an unthreaded exterior and a partially threaded interior. The insert may be fixed within the one unthreaded hole.

20 Claims, 8 Drawing Sheets

THREADED INSERTS ON WEATHERPROOF ELECTRICAL JUNCTION BOXES

CROSS REFERENCE TO RELATED APPLICATIONS

This document claims the benefit of the filing date of U.S. Provisional Patent Application 61/373,225, entitled "Threaded Inserts on PVC WP Boxes" to Shotey, et al., which was filed on Aug. 12, 2010, the contents of which is hereby incorporated herein by reference.

BACKGROUND

1. Technical Field

Aspects of this document relate generally to varieties of electrical junction boxes.

2. Background Art

Injection molded conduit boxes are often used in connection with reducing bushing that allow a threaded conduit to mate with an insert in the box. The conduit typically couples to a threaded interior of the insert. The insert, in turn, is threaded on the exterior to mate with a threaded opening on the injection molded conduit box. Typical injection molded conduit boxes require threading of holes on the box after the box has been molded. The requirement to screw and unscrew cores to make these box holes threaded is time consuming, inconvenient, and inefficient.

SUMMARY

A weatherproof electrical junction box may comprise a molded electrical junction box with at least one unthreaded hole and an insert. In one aspect, the molded electrical junction box may comprise four side walls, a back wall, a front opening, two or more screw bosses extending toward the front opening, and at least one unthreaded hold extending through a first side of the four side walls.

In one aspect, the insert may comprise an unthreaded exterior and a partially threaded interior. The insert may be fixed within the unthreaded hole of the molded electrical junction box.

Specifically, the unthreaded hole may be substantially circular and the insert may be substantially cylindrical. For particular implementations, the insert may be fixed within the at least one unthreaded hole by solvent bonding the molded insert to the molded electrical junction box while the molded insert is within the unthreaded hole. For other implementations, the insert may be fixed within the unthreaded hole by press fitting the insert within the at least one hole of the molded electrical junction box. For still other implementations, the insert may be fixed within the unthreaded hole by a fastener. For other implementations, the unthreaded hole may comprise reentrant openings on a border of the hole, and the insert may comprise nubs on the non-threaded exterior of the insert. In these implementations, the nub may be sized to fit within the reentrant opening.

Specifically, the unthreaded may be substantially rectangular in shape and the exterior of the insert may be shaped substantially rectangular cuboid.

Specifically, the at least one unthreaded hole may comprise two unthreaded holes extending through opposing side walls. For particular implementations, the insert may comprise at least two inserts each fixed within a different one of the two unthreaded holes by solveng bonding the molded insert to the molded electrical junction box while the molded inserts are in the two unthreaded holes extending through opposing side walls.

A method for manufacturing weatherproof electrical junction box may comprise molding and electrical junction box and fixing an insert within an unthreaded hole on the molded electrical junction box. In one aspect, the method may comprise molding an electrical junction box comprising at least four side walls, a back wall, a front opening, at least two screw bosses extending toward the front opening, and at least one unthreaded hole within a first side wall of the four side walls.

In one aspect the method may comprise fixing an insert within the at least one unthreaded hole. The insert may comprise an unthreaded exterior and an at least partially threaded interior.

Specifically, fixing the insert within the hole may comprise fixing the insert within the at least one unthreaded hole with a bonding solvent.

Specifically, fixing the insert within the hole may comprise press fitting the insert within the at least one unthreaded hole.

Specifically, fixing the insert within the hole may comprise fixing the insert within the at least one unthreaded hole with at least one fastener.

Specifically, the at least one hole may comprise at least one reentrant opening and the unthreaded exterior of the insert may comprise at least one nub sized to fit within the at least one reentrant opening. For particular implementations, fixing the insert within the hole may comprise fixing the insert within the at least one unthreaded hole by fitting the at least one nub into the at least one reentrant opening.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The invention will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended threaded insert and weatherproof electrical junction box and/or assembly procedures for a threaded insert and waterproof electrical junction box will become apparent for use with implementations of threaded inserts and weatherproof electrical junction boxes from this disclosure. Accordingly, for example, although particular sizes, types, and materials are disclosed, such sizes, types, and materials and implementing components may comprise any shape, size, style, type, model, version, measurement, concentration, material, quantity, and/or the like as is known in the art for such threaded inserts and weatherproof electrical junction boxes and implementing components, consistent with the intended operation of a weatherproof electrical junction box.

Figure 1:
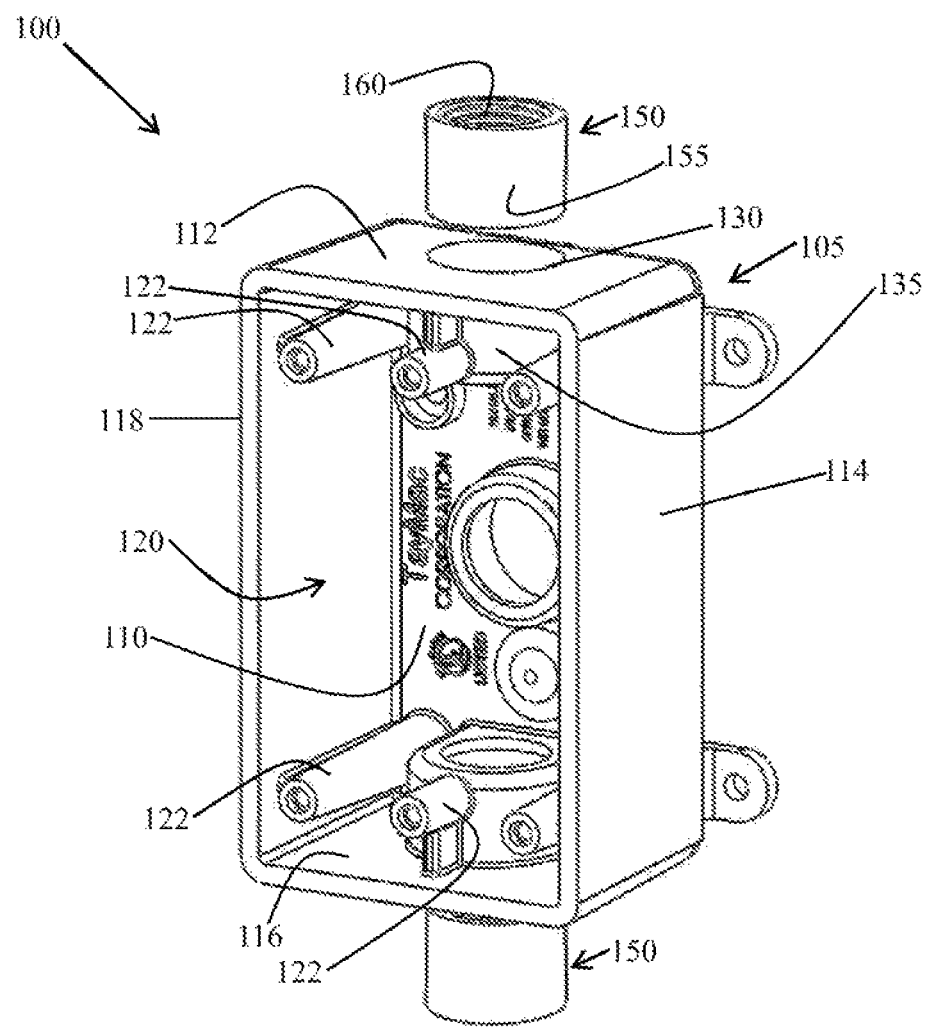
FIG. 1 is a partial break-apart perspective view of a first implementation of the threaded insert and weatherproof electrical junction box.

In FIG. 1, a particular implementation of a weatherproof electrical junction box 100 is depicted. In various embodiments, the weatherproof electrical junction box 100 may be used in conjunction with conduits or as a junction or outlet box. The weatherproof electrical junction box may comprise a molded box 105 and an insert 150. The molded box 105 may be comprised of any variety of material or materials, such as but not limited to any type of plastic, metal, rubber or any combination thereof. In the implementation of FIG. 1, the molded box 105 is comprised of PVC. The molded box 105 may be created, manufactured, or shaped through a variety of processes, such as but not limited to injection molding. The molded box 105 may further comprise at least four side walls 112, 114, 116, 118, a back wall 110, a front opening 120, and a plurality of screw bosses 122, 122a. As shown in FIG. 1, the screw bosses 122 can extend forwardly from the back wall 110, while boss 122a extends from a receiver element 135.

The molded box 105 may further comprise at least one unthreaded hole 130 within a first side wall 112. Various implementations may comprise any number of unthreaded, round or other shaped holes 130 on any of the at least four side walls 112, 114, 116, 118. For example, an implementation may comprise one unthreaded hole 130 on each side wall 112, 114, 116, 118. In the implementation of FIG. 1, the molded box 105 comprises two unthreaded holes 130 on opposing side walls 112, 116. The at least one unthreaded hole 130 may be left open during the molding process, or may be stamped or cut out at any time after the molding process. The unthreaded hole 130 may extend all the way through the respective side wall 112, 114, 116, or 118, or may only extend partially into the side wall 112, 114, 116, 118. In some implementations, the unthreaded hole 130 may be substantially circular in shape, while in other implementations, the unthreaded hole 130 may comprise any shape, such as but not limited to a triangle, square, pentagon, hexagon, and the like.

The molded box 105 may further comprise a receiver element 135. The receiver element 135 may be sized and/or shaped substantially similar to the unthreaded hole 130 and be coupled to the side wall 112, 114, 116, 118 within the molded box 105 such that the insert 150 may fit within both the unthreaded hole 130 and the receiver element 135 simultaneously. The receiver element 135 may comprise a separate piece or element molded or coupled to the sidewall 112, 114, 116, 118 at the unthreaded hole 130, or may comprise a continuous piece with the sidewall 112, 114, 116, 118 molded within the boundaries of the molded box 105 at the unthreaded hole 130. In some implementations, the receiving element 135 may comprise an extension of the unthreaded hole 135 into or within the boundaries set by the molded box 105. In various implementations, the weatherproof electrical junction box may comprise base that prevents an insert 150 and/or a conduit from sliding all the way through the side wall 112 into the molded box 105.

The weatherproof electrical junction box 100 may further comprise at least one insert 150 sized to fit within the at least one unthreaded hole 130. The insert 150 may also be sized to fit within the receiving element 135. The insert 150 may also be created through injection molding, or through any other molding process in one or more pieces. In a particular implementation, the insert 150 is molded as a single piece that is split along one side and attached by a thin layer of plastic on the other so that it folds over upon itself to create the insert 150. In other implementations, the insert 150 may be shaped or created by any process known in the art. In still other implementations, the insert 150 may be composed of the same or different material than the molded box 105. For example, and not limitation, the insert 150 may be comprised of substantially metal material while the molded box 105 is primarily made of PVC or other plastic.

The insert 150 may, in various implementations, comprise an unthreaded exterior 155 and an at least partially threaded interior 160. The unthreaded exterior 155 and the threaded interior 160 may be comprised of the same or similar materials, or may be comprised of different materials. For example, and not by limitation, the unthreaded exterior 155 may comprise plastic or PVC, while the threaded interior 160 may comprise a substantially metallic material. The threaded interior 160 may further be sized to hold or coupled to a conduit. The insert 150 may comprise any three-dimensional shape, such as but not limited to a cylinder, rectangular prism, cube, and the like. In various implementations, the insert 150 is shaped to fit within the unthreaded hole 130. For example, a cylindrical insert 150 may be sized to insert into a circular unthreaded hole 130. A cube or rectangular prism insert may be sized to insert into a square unthreaded hole, and a hexagonal prism insert may be sized to insert into a hexagonal unthreaded hole.

In various implementation, the at least one insert 150 may be fixed within the at least one threaded hole 130. The insert 150 may be fixed in place within the unthreaded hole 130 through any variety of materials, elements, or mechanisms, such as but not limited to bonding solvents, adhesives, press fitting, fasteners, ball bearings, spring locks, nubs (see FIGS. 4-5), or the like. Bonding solvents or adhesives may be applied to the insert 150, the unthreaded hole 130, and/or the receiving element 135 at any point before or after manufacture. Fasteners may comprise a variety of elements or mechanisms, such as but not limited to at least one set-screw, at least one clamp, and the like on the unthreaded hole 130 or the receiver element 135 coupled to the unthreaded hole 130. In implementations comprising a two or more-sided shaped unthreaded hole 130 and a correspondingly shaped insert 150, the shape of the unthreaded hole 130 may act to fix the insert 150 within the unthreaded hole 130. For example, if the unthreaded hole 130 is square and the insert 150 comprises a cube or rectangular prism, the corners of the square unthreaded hole 130 may prevent the insert 150 from turning or rotating while the insert is within the unthreaded hole 130.

Figure 2:
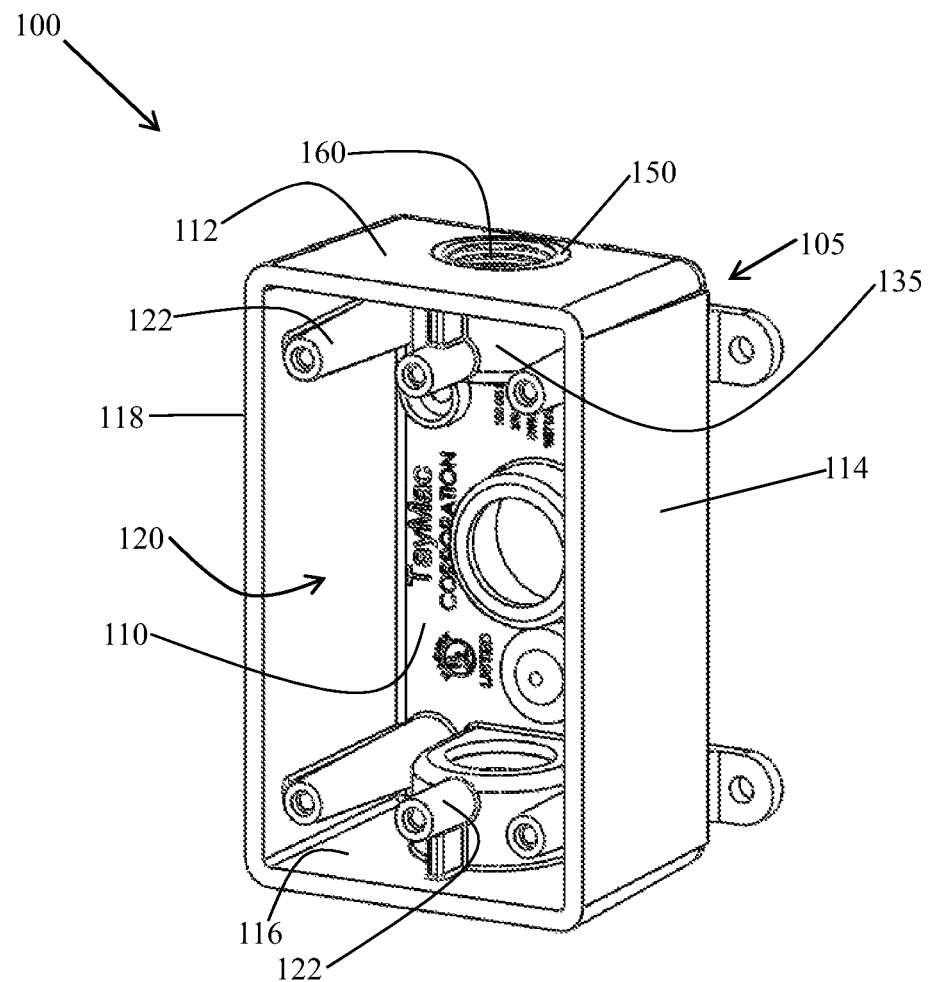
FIG. 2 is a perspective view of a first implementation of the threaded insert within the hole on the weatherproof electrical junction box.

In FIG. 2, an implementation is shown with the insert 150 within the unthreaded hole 130. In the implementation of FIG. 2, the insert 150 extends through the unthreaded hole 130 and at least partially into the receiving element 135.

Figure 3:
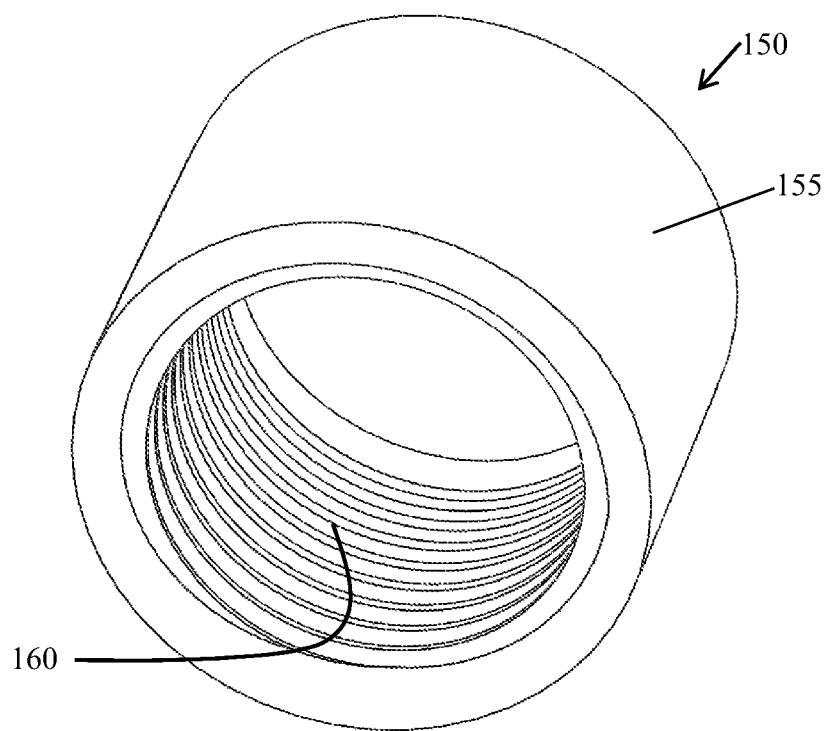
FIG. 3 is a perspective view of a first implementation of the threaded insert.

In FIG. 3, a close up view of the insert 150 is shown. In the implementation depicted, both the unthreaded exterior and the threaded interior are substantially cylindrical in shape. In other implementations, both the threaded interior and the unthreaded exterior may comprise any of the substantially same or different shapes. For example and not limitation, the exterior of the insert 150 may be comprised of a substantially cubed or rectangular prism shaped while the interior remains substantially circular.

Figure 4:
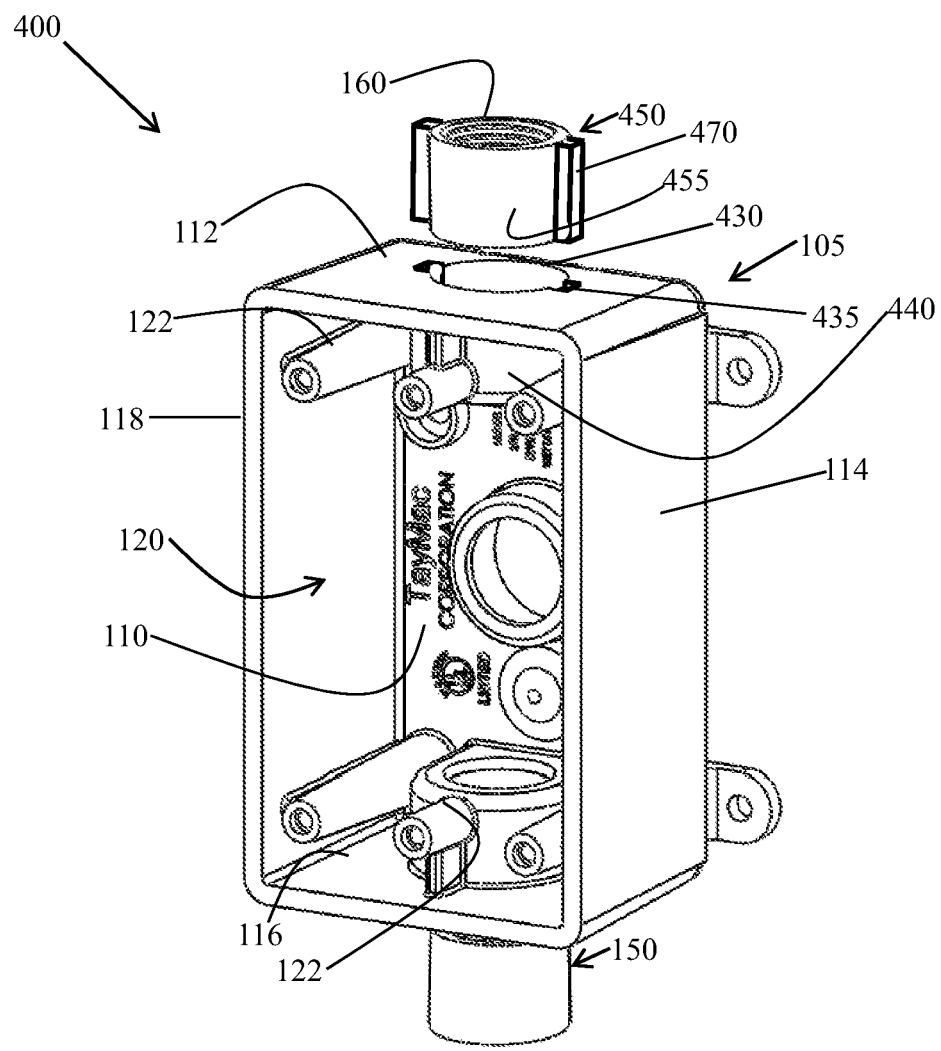
FIG. 4 is a partial break-apart perspective view of a second implementation of the threaded insert and weatherproof electrical junction box.

In FIG. 4, another implementation of a weatherproof electrical junction box 400 is depicted. In this and other implementations, the unthreaded hole 430 comprises at least one reentrant opening 435 on a boundary of the unthreaded hole 430. The receiver element 440 may also comprise at least one slot that aligns with the at least one reentrant opening 435 of the unthreaded hole 430. In various implementations, the unthreaded hole 430 and the receiver element 440 may comprise any number of reentrant openings 435 and slots, respectively. In the implementation of FIG. 4, the unthreaded hole 430 comprises two reentrant openings 435.

Figure 5:
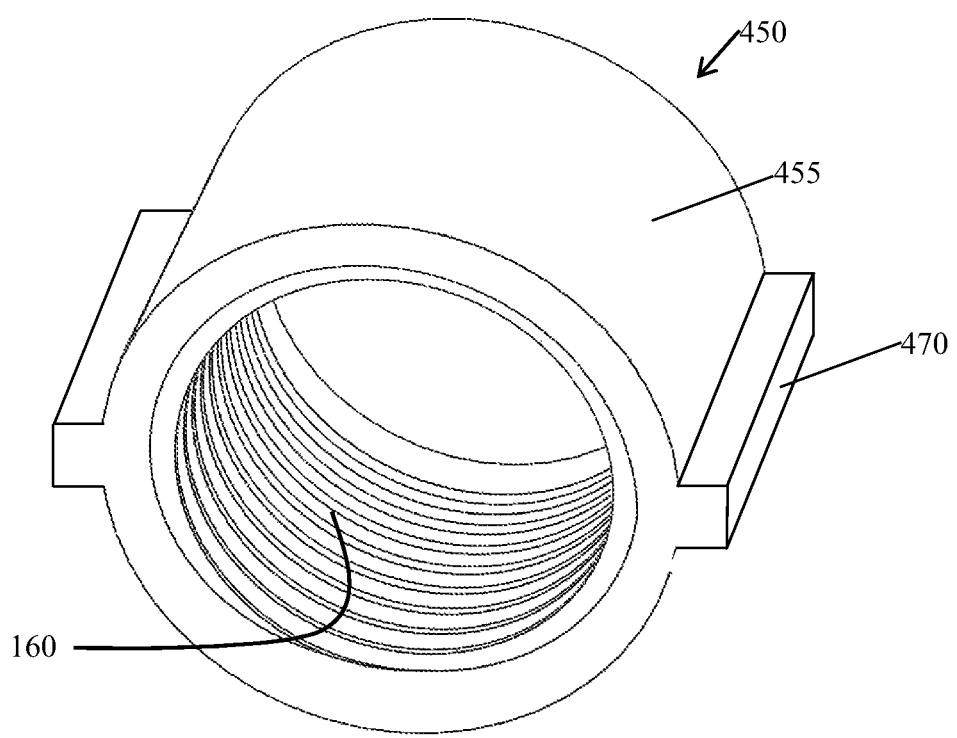
FIG. 5 is a perspective view of a second implementation of the threaded insert.

The implementation of the weatherproof electrical junction box 400 may further comprise an insert 450 comprising at least one nub 470 sized to fit within the at least one reentrant opening 435 and the at least one slot of the receiver element 440. In various implementations, the insert 450 may comprise any number of nubs 470. The insert 450 will typically, though not always, comprise the same number of nubs 470 as the number of reentrant openings 435 on the unthreaded hole 430. In FIG. 5, a perspective view of the insert 450 with two nubs 470 is shown.

Figure 6:
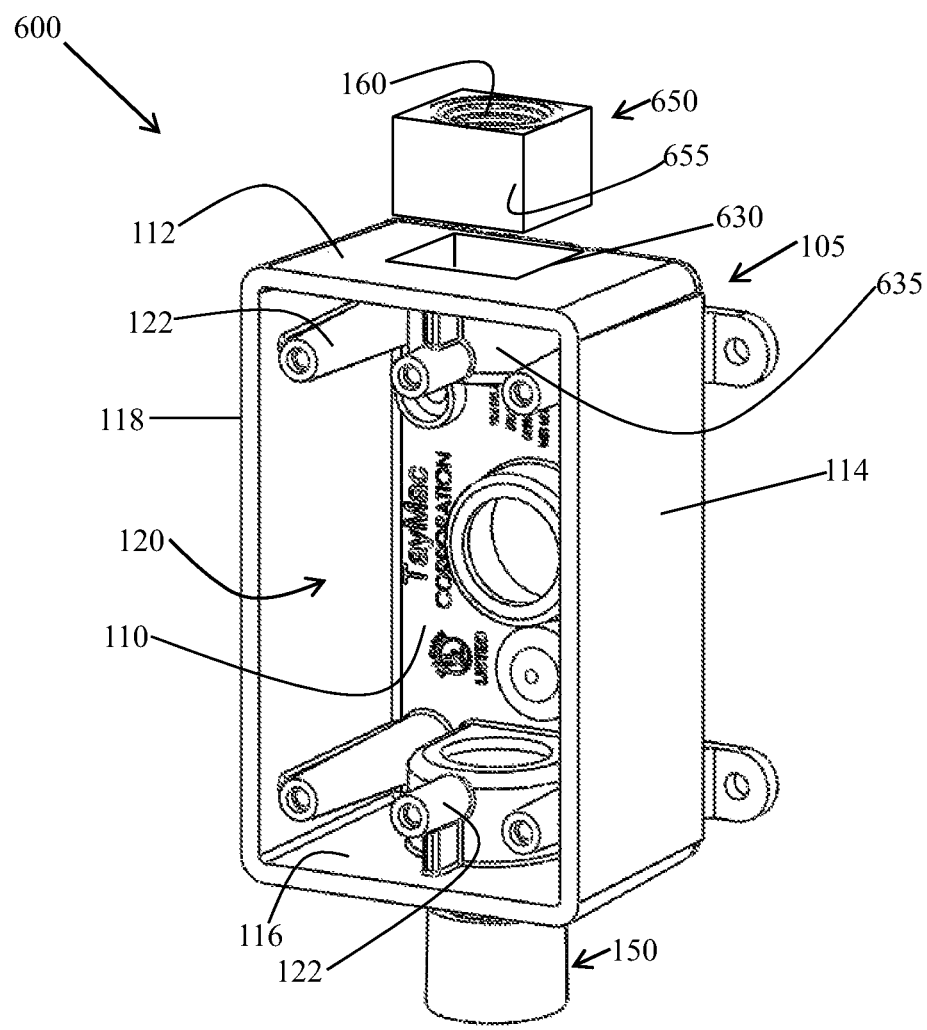
FIG. 6 is a partial break-apart perspective view of a third implementation of the threaded insert and weather proof box.
Figure 7:
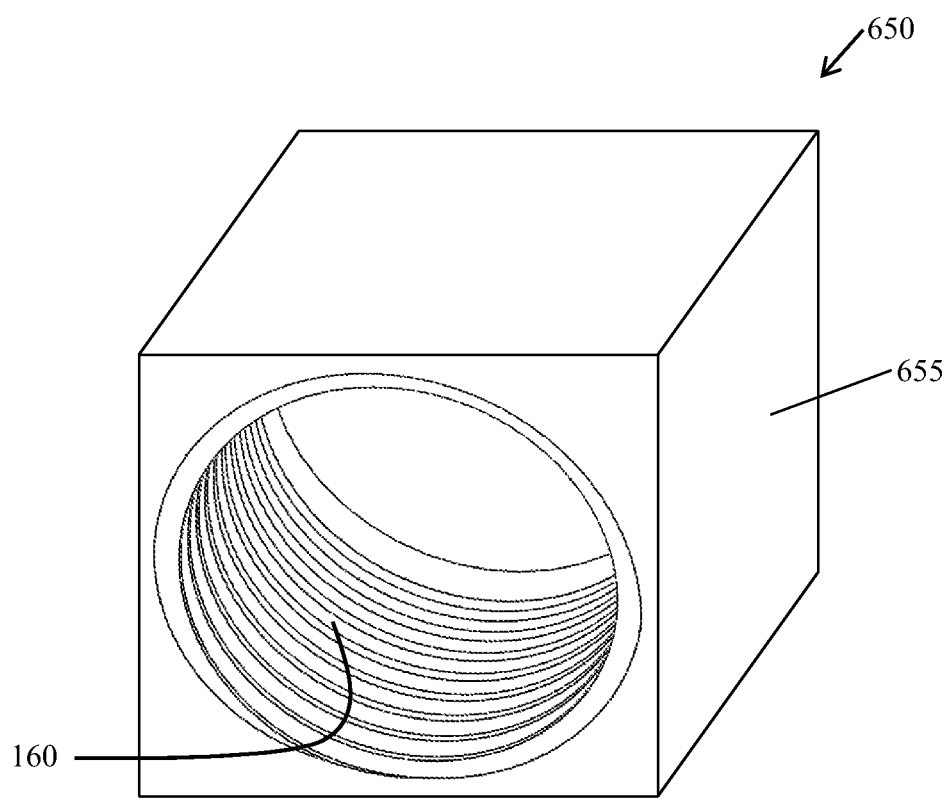
FIG. 7 is a perspective view of a third implementation of the threaded insert.

In FIG. 6, another implementation of a weatherproof electrical junction box 600 is depicted. In this and other implementations, the unthreaded hole 630 may be substantially square or rectangular in shape. The receiver element 635 may also be substantially cuboid or rectangular prism in shape to match the shape of the unthread hole 630. As depicted in FIGS. 6 and 7, the insert 650 may comprise a substantially rectangular prism or cuboid shape, sized to fit within the unthreaded hole 630. In such implementations, the fit of the squared insert 650 within the squared unthreaded hole 630 prevents the insert 650 from rotating when a conduit or any other element is screwed into the threaded interior 160. Therefore, less or even no other fixing mechanisms or materials may be required.

Figure 8:
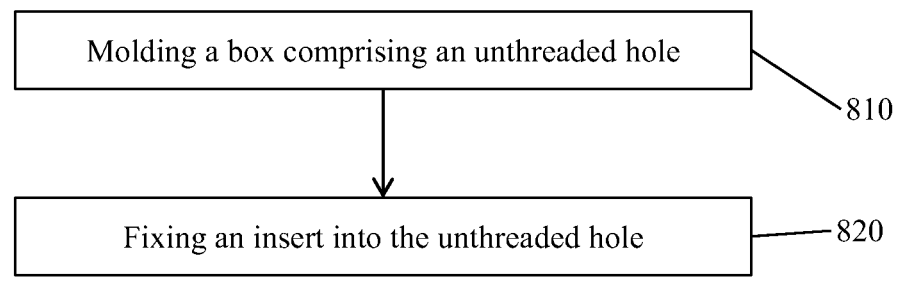
FIG. 8 is a flow chart of a method for manufacturing a weatherproof electrical junction box.

In FIG. 8, a flow diagram of a method for manufacturing a weatherproof electrical junction box is shown. In various implementations, the method may comprise molding a box comprising an unthreaded hole 810. The box may further comprise at least four side walls, a back wall, a front opening, and at least two screw bosses extending toward the front opening. The unthreaded hole may be located within a first side wall of the at least four side walls. In various implementations the method may comprise cutting the unthreaded hole into the first side wall. In other implementations, the method may comprise molding the unthreaded hole into the first side wall.

The method may further comprise fixing an insert into the unthreaded hole 820. The insert may comprise an unthreaded exterior and an at least partially threaded interior. In various implementations, fixing the insert within the unthreaded hole may comprise fixing the insert within the at least one unthreaded hole with a bonding solvent, an adhesive, at least one fastener, or in combination with mating nubs on the insert and reentrant openings on the unthreaded hole. In still other implementations, fixing the insert within the at least one unthreaded hole may comprise press fitting the insert within the at least one unthreaded hole.

It will be understood that implementations are not limited to the specific components disclosed herein, as virtually any components consistent with the intended operation of a method and/or system implementation for molding a box or fixing inserts to a box may be utilized. Accordingly, for example, although particular materials may be disclosed, such components may comprise any shape, size, style, type, model, version, class, grade, measurement, concentration, material, weight, quantity, and/or the like consistent with the intended operation of a method and/or system implementation for a molding a box or fixing inserts to a box may be used.

In places where the description above refers to particular implementations of a weatherproof electrical junction box, it should be readily apparent that a number of modifications may be made without departing from the spirit thereof and that these implementations may be applied to other boxes. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

The invention claimed is:

1. A weatherproof electrical junction box, comprising:
   a molded electrical junction box comprising at least four side walls, a back wall, a front opening, at least two screw bosses extending toward the front opening, and at least one unthreaded hole extending through a first side wall of the at least four side walls; and
   an insert having an unthreaded exterior and an at least partially threaded interior, the insert being fixed within the at least one unthreaded hole such that an outermost end of the insert is substantially flush with an outer surface of the first side wall.

2. The weatherproof electrical junction box of claim 1, wherein the at least one unthreaded hole is substantially circular and the insert is substantially cylindrical.

3. The weatherproof electrical junction box of claim 2, wherein the insert is fixed within the at least one unthreaded hole by solvent bonding the molded insert to the molded electrical junction box while the molded insert is within the at least one hole.

4. The weatherproof electrical junction box of claim 2, wherein the insert is fixed within the at least one hole by press fitting the molded insert within the at least one hole of the molded electrical junction box.

5. The weatherproof electrical junction box of claim 2, wherein the insert is fixed within the at least one hole by at least one fastener.

6. The weatherproof electrical junction box of claim 2, wherein the at least one hole further comprises at least one reentrant opening on a border of the at least one hole, and the insert further comprises at least one nub on the non-threaded exterior, the nub sized to fit within the at least one reentrant opening.

7. The weatherproof electrical junction box of claim 1, wherein the at least one hole is substantially rectangular and the exterior of the insert has a substantially rectangular cuboid shape.

8. The weatherproof electrical junction box of claim 1, wherein the at least one unthreaded hole comprises two unthreaded holes extending through opposing side walls.

9. The weatherproof electrical junction box of claim 8, wherein the insert comprises at least two inserts each fixed within a different one of the two unthreaded holes by solvent bonding the molded insert to the molded electrical junction box while the molded inserts are in the two unthreaded holes extending through opposing side walls.

10. The weatherproof electrical junction box of claim 1, wherein a socket extends inwardly from an inner surface of the first side wall and aligned with the at least one unthreaded hole to facilitate receiving the insert.

11. The weatherproof electrical junction box of claim 1, wherein the at least two screw bosses extend forwardly from an inner surface of the back wall.

12. A method for manufacturing a weatherproof electrical junction box, comprising the steps of
    molding an electrical junction box comprising at least four side walls, a back wall, a front opening, at least two screw bosses extending toward the front opening, and at least one unthreaded hole within a first side wall of the at least four side walls;
    fixing an insert within the at least one unthreaded hole such that an outermost end of the insert is substantially flush with an outer surface of the first side wall, the insert comprising an unthreaded exterior and an at least partially threaded interior.

13. The method of claim 12, wherein fixing the insert within the at least one unthreaded hole comprises fixing the insert within the at least one unthreaded hole with a bonding solvent.

14. The method of claim 12, wherein fixing the insert within the at least one unthreaded hole comprises press fitting the insert within the at least one unthreaded hole.

15. The method of claim 12, wherein fixing the insert within the at least one unthreaded hole comprises fixing the insert within the at least one unthreaded hole with at least one fastener.

16. The method of claim 12, wherein the at least one hole further comprises at least one reentrant opening, the unthreaded exterior of the insert further comprises at least on nub sized to fit within the at least one reentrant opening, and fixing the insert within the at least one unthreaded hole comprises fixing the insert within the at least one unthreaded hole by fitting the at least one nub into the at least one reentrant opening.

17. The weatherproof electrical junction box of claim 10, wherein the socket is unitarily formed as a single member with the molded electrical junction box.

18. The weatherproof electrical junction box of claim 10, wherein a base of the socket limits an insertion depth of the insert through the at least one unthreaded hole.

19. The weatherproof electrical junction box of claim 10, wherein the socket has a shape corresponding to a shape of the at least one unthreaded hole.

20. The weatherproof electrical junction box of claim 10, wherein at least one of the at least two screw bosses extends forwardly from the socket.

* * * * *